United States Patent
Hashimoto et al.

[11] Patent Number: 6,007,732
[45] Date of Patent: Dec. 28, 1999

[54] REDUCTION OF REFLECTION BY AMORPHOUS CARBON

[75] Inventors: Koichi Hashimoto; Toshiyuki Ohtsuka; Fumihiko Shinpuku; Daisuke Matsunaga; Takayuki Enda, all of Kawasaki, Japan

[73] Assignee: Fujitsu Limited, Kawasaki, Japan

[21] Appl. No.: 08/841,787

[22] Filed: May 5, 1997

Related U.S. Application Data

[63] Continuation of application No. 08/216,963, Mar. 24, 1994, Pat. No. 5,656,128.

[30] Foreign Application Priority Data

Mar. 26, 1993 [JP] Japan ........................................ 5-68717

[51] Int. Cl.$^6$ ................................................ H01L 21/302
[52] U.S. Cl. ..................... 216/47; 430/5; 216/51; 216/79; 216/81; 438/717; 438/725; 438/736; 438/952
[58] Field of Search ..................... 438/725, 717, 438/719, 721, 736, 950, 952; 216/47, 50, 51, 79, 81; 430/5

[56] References Cited

U.S. PATENT DOCUMENTS

| | | | |
|---|---|---|---|
| 4,975,144 | 12/1990 | Yamazaki et al. | 156/643 |
| 5,102,498 | 4/1992 | Itoh et al. | 156/643 |
| 5,240,554 | 8/1993 | Hori et al. | 156/643 |
| 5,302,240 | 4/1994 | Hori et al. | 156/643 |
| 5,437,961 | 8/1995 | Yano et al. | 156/643.1 |
| 5,656,128 | 8/1997 | Hashimoto et al. | 216/47 |

FOREIGN PATENT DOCUMENTS

| | | |
|---|---|---|
| 60-117723 | 6/1985 | Japan . |
| 60-235426 | 11/1985 | Japan . |
| 63-073559 | 4/1988 | Japan . |
| 2-71518 | 3/1990 | Japan . |
| 5-90224 | 4/1993 | Japan . |
| 5-114558 | 5/1993 | Japan . |
| 5-114559 | 5/1993 | Japan . |

OTHER PUBLICATIONS

"Influence of DC Bias Voltage on the Refractive Index and Stress of Carbon–Diamond Films Deposited From Methane/Argon RF Plasma", J. Appl. Phys.; 1991, Amaratunga et al., 5374–5379.

"Etch Masks of Semimetallic Amorphous Carbon Thin Films Produced By Electro–Beam Sublimation of Graphitic Carbon", J. Vac. Sci. Tech.; B (1992), 10 (6); pp. 2681–2684, Porkolab et al.

*Primary Examiner*—Benjamin Utech
*Assistant Examiner*—George Goudreau
*Attorney, Agent, or Firm*—Nikaido, Marmelstein, Murray & Oram LLP

[57] ABSTRACT

A pattern forming method having a step of forming an amorphous carbon film on a patterning layer formed on a substrate, a step of forming a photoresist film on the amorphous carbon film, a step of selectively exposing and developing the photoresist film to form a photoresist pattern, and a step of successively dry-etching the amorphous carbon film and the patterning layer by using the photoresist film as an etching mask. Desired optical constants of an amorphous carbon film formed by sputtering can be obtained by controlling a substrate temperature and other parameters.

3 Claims, 11 Drawing Sheets

REDUCTION OF REFLECTION BY AMORPHOUS CARBON

This is a continuation of application Ser. No. 08/216,963 filed Mar. 24, 1994 now U.S. Pat. No. 5,656,128.

BACKGROUND OF THE INVENTION a) Field of the Invention

The present invention relates to a pattern forming technique which uses an amorphous carbon (a-C), and more particularly to a pattern forming technique which includes the process of forming and/or etching an a-C film. In this specification, the term "amorphous carbon (a-C)" is intended to include those having dangling bonds terminated with hydrogen or the like.

b) Description of the Related Art

To improve the integration degree of semiconductor large scale integrated (LSI) circuits, it is necessary to miniaturize circuit elements, wirings, and the like. To obtain fine structures, it is necessary to narrow a minimum line pattern width and improve patterning precision. It has been desired therefore to improve a resolution of photolithography.

The resolution of photolithography depends on a numerical aperture and a wavelength of light. As the numerical aperture is increased, the depth of focus becomes shallow. Photolithography for a substrate having steps such as multilayered wirings requires some depth of focus, so that an increase of the numerical aperture is limited. It is therefore preferable to shorten the wavelength of light in order to improve the resolution.

In photolithography of a semiconductor manufacturing technique, the wavelength of exposure light has shortened from the g line to i line (365 nm) of mercury, to KrF excimer laser beam (248 nm), and to ArF excimer laser beam (193 nm).

Photolithography is used in some cases for a layer whose underlying layer is made of Si, refractory metal silicide such as tungsten silicide, or refractory metal such as tungsten. These materials have a high reflectance in the ultraviolet (UV) wavelength range. A reflectance of Si increases greatly from the visual light wavelength range to the ultraviolet wavelength range. In some cases, such a high reflectance material is formed under a transparent layer made of silicon oxide or the like.

If an underlying layer of a photoresist layer has a high reflectance, strong light reflected from the underlying layer lowers a photolithography precision. The precision is lowered more when the surface of an underlying layer has a slanted area. It has been desired to form an anti-reflection (reflection reducing) film which efficiently reduces reflected light from an underlying layer. A photolithography technique using an amorphous carbon film as an antireflection film has been proposed by Y. Suda et al, Proc. SPIE, 1674, pp.350–361 (1942). This paper describes a technique of forming an amorphous carbon film as an antireflection film on a high reflectance film or on a transparent film formed on a high reflectance film, and values of real parts (refractive index n) and imaginary parts (extinction coefficient k) of complex refractive index (N) suitable for an antireflection film.

FIGS. 9A to 9E illustrate an example of a conventional photolithography technique using an a-C film as an antireflection film. As shown in FIG. 9A, a polycide layer of a polycrystalline silicon film 102 and tungsten silicide film 102 is formed on an underlying layer 101. This polycide layer has a high reflectance for an ultraviolet ray.

On the tungsten silicide film 103, an a-C film 104 is deposited to a predetermined thickness to form an antireflection film. A photoresist layer 105 of negative type is coated on the a-C film 104.

Ultraviolet rays 106 are applied to a selected area of the photoresist layer 105. Photoresist exposed to ultraviolet rays undergoes chemical reactions and becomes insoluble to developing liquid.

Reflection of light passed through the photoresist layer 105 is reduced because the surface of the tungsten silicide layer 103 is covered by the a-C film 104. Since the amount of reflected light is reduced, a resolution can be prevented from being lowered by reflected light as compared to the case where a photoresist layer 105 is formed directly on a tungsten silicide layer 103.

As shown in FIG. 9B, the photoresist layer 105 is developed by developing liquid to form a resist pattern 105a, by leaving only the area of the light-exposed photoresist layer. The developing liquid is, for example, alkali solution which does not etch the a-C film 104.

As shown in FIG. 9C, the exposed area of the a-C film 104 is etched by reactive ion etching (RIE) with $O_2$ gas to form an a-C pattern 104a having the same pattern as the resist pattern 105a. Carbon reacts with O and is vaporized in the form of $CO_2$. The tungsten silicide layer 103 is not etched by $O_2$ RIE.

As shown in FIG. 9D, by using the resist pattern 105a and a-C pattern 104a as an etching mask, the tungsten silicide layer 103 and polycrystalline silicon layer 102 are selectively etched to form a tungsten silicide pattern 103a and a polycrystalline silicon pattern 102a respectively having a desired shape.

After the tungsten silicide layer and polycrystalline silicon layer are patterned into a desired shape, both the resist pattern 105a and a-C pattern 104a are removed at the same time by ashing with oxygen plasma as shown in FIG. 9E.

As described above, an a-C film formed on a high reflectance layer functions as an antireflection film, enabling to reduce reflected light and prevent a resolution from being lowered.

However, additional processes are required for forming and removing an a-C film as an antireflection film. In addition, there are many uncertain points regarding how an a-C film having physical constants suitable for an antireflection film can be formed.

SUMMARY OF THE INVENTION

It is an object of the present invention to provide a photolithography technique capable of minimizing an increase of the number of photolithography processes even if an a-C film is used as an antireflection film.

It is another object of the present invention to provide a technique of forming an a-C film having physical constants suitable for an antireflection film.

According to one aspect of the present invention, there is provided a pattern forming method comprising the steps of forming an amorphous carbon film on a patterning layer formed on a substrate, forming a photoresist film on the amorphous carbon film, selectively exposing and developing the photoresist film to form a photoresist pattern, and successively dry-etching the amorphous carbon film and the patterning layer by using the photoresist film as an etching mask.

It is preferable that the dry-etching step includes an etching step using an etching gas in the form of plasma containing at least one of fluorine and chlorine.

It is preferable that the amorphous carbon film forming step Is performed by sputtering. More preferably, at least a substrate temperature is selected at this sputtering step, and still more preferably, in addition to the substrate temperature an atmospheric gas pressure and a sputtering electric power are selected at this sputtering step, to set the real and imaginary parts of a complex refractive index in an optimum value range at a desired wavelength.

Even if an amorphous carbon film is used as an antireflection film, an increase of the number of photolithography processes can be minimized by successively dry-etching the amorphous carbon film and a patterning layer.

An amorphous carbon film can be formed reliably by sputtering. At this sputtering, at least a substrate temperature, and more preferably, in addition to the substrate temperature an atmospheric gas pressure and a sputtering electric power are selected so that a complex refractive index of an amorphous carbon film can be controlled efficiently.

DETAILED DESCRIPTION OF THE PREFERRED EMBODIMENTS

Figure 1A:
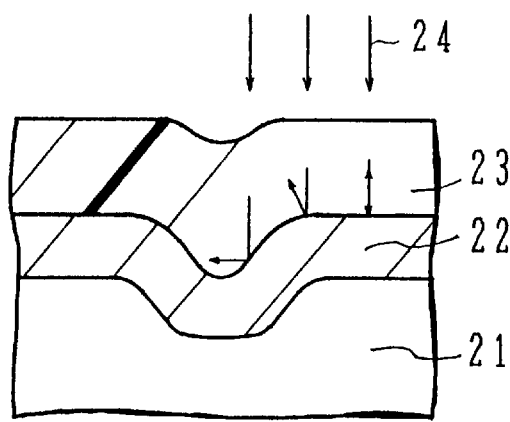
FIGS. 1A to 1C are schematic diagrams explaining the function of an antireflection film.

First, the function of an antireflection film will be explained. Consider the case wherein a conductive layer 22 such as metal, semiconductor, and silicide, is formed on an underlying layer 21 having an uneven surface and thereafter patterned, as shown in FIG. 1A.

A photoresist layer 23 is coated on the conductive layer 22 and selectively exposed by applying ultraviolet rays 24. If the surface of the conductive layer 22 under the photoresist layer 23 has a high reflectance, light passed through the photoresist layer 23 and reached the conductive layer 22 is reflected by the conductive layer 22 and reflected back to the photoresist layer 23.

If the surface of the underlying layer 21 is uneven, the surface of the conductive layer 22 becomes uneven correspondingly. Light incident on the surface of the conductive layer 22 in the vertical direction to the surface is reflected in the same direction. However, at the slanted surface of the conductive layer 22, even if light is applied in the vertical direction relative to the substrate, it has some angle relative to the surface of the conductive layer 22 so that the reflected light propagates in the direction different from the incident light. Such dispersion of the reflected light pertains not only to the vertical incident light but also to other incident light.

Reflected light propagating to the area other than the exposure area lowers the precision of a pattern to be formed. In order to prevent the patterning precision from being lowered by reflected light, it is efficient to reduce light reflected from the surface of the conductive layer 22.

Figure 1B:
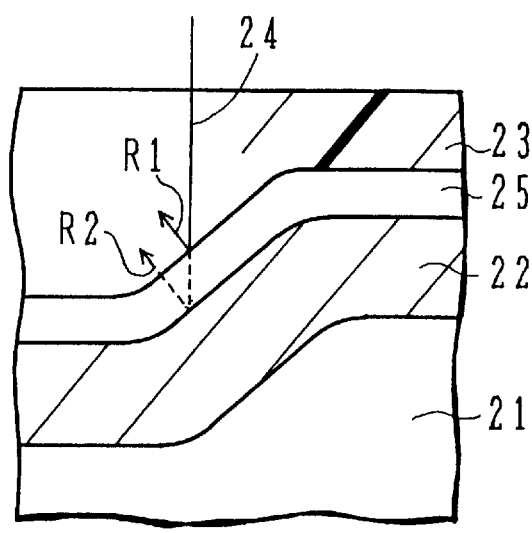

FIG. 1B shows a resist film 23 coated on an antireflection film 25 formed on the surface of a conductive layer 22. Reference numeral 24 represents a ultraviolet ray 24 transmitting through the resist film 23, R1 represents light reflected from the surface of the antireflection film 25, and R2 represents light reflected from the surface of the conductive layer 22.

If the intensities of these reflected light rays are small, reflected light rays in the resist film 23 can be reduced. If the optical properties of the resist film 23 and antireflection film 25 are similar, the reflected light R1 can be reduced. If attenuation of light in the antireflection film 25 is great, the reflected light R2 can be reduced.

Furthermore, if reflected right rays R1 and R2 have opposite phases, a substantial reflected light ray is a difference between the light rays R1 and R2. If the antireflection film 25 satisfying such conditions is coated on the surface of the conductive layer 22, reflected light from the conductive layer 22 can be reduced.

Figure 1C:
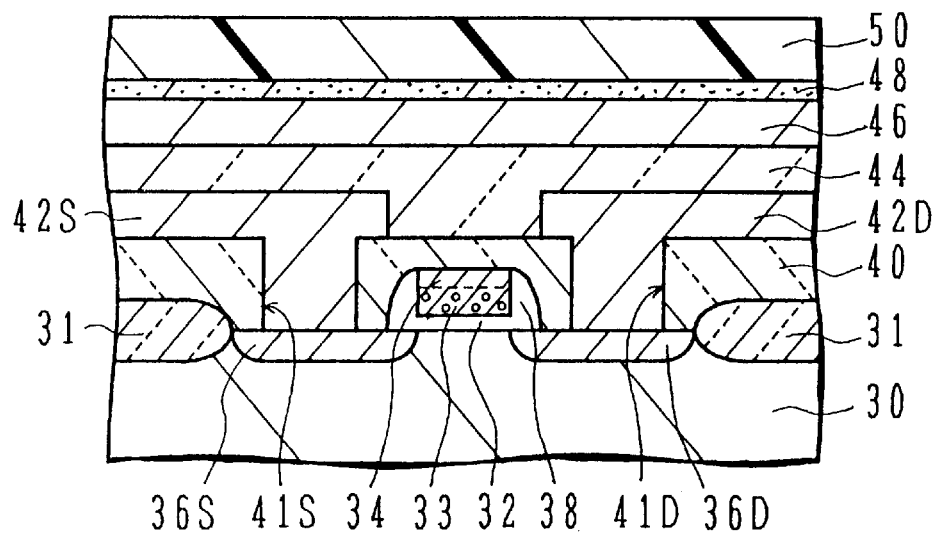

FIG. 1C illustrates an application of an antireflection film to manufacturing a MOSFET. On the surface of a p-type Si substrate 30, a field oxide film 31 is formed by local oxidation of silicon (LOCOS). A gate oxide film 32 is formed on the surface of the Si substrate 30. On the gate oxide film 32, a polycide gate electrode is formed of a polycrystalline Si film 33 and a tungsten silicide film 34.

By using the polycide gate electrode as a mask, regions 36S and 36D doped with $n^+$-type ions are formed on the surface of the Si substrate 30. An oxide film 38 is formed on the side wall of the gate electrode. A silicon oxide film 40 as an interlayer insulating film covers the side wall oxide film 38.

Contact holes 41S and 41D are formed in the silicon oxide film 40 at the positions corresponding to the $n^+$-type regions 36S and 36D. In these contact holes, a source electrode 42S and a drain electrode 42D respectively made of, for example, polycide, are in contact with the source and drain regions 36S and 36D. An interlayer insulating film 44 covers the source/drain electrodes 42S and 42D, and a wiring layer 46 is formed on the interlayer insulating film 44.

An a-C film 48 functioning as an antireflection film is formed on the wiring layer 46 on which a photoresist film 50 is coated. In the selective exposure for the photoresist film 50, incident light to the a-C film 48 receives the antireflection effect of the a-C film 48 so that reflection from the wiring layer 46 can be reduced.

In this example, the a-C film 48 is used as an antireflection film for the wiring layer 46. Similar a-C films may be used as an antireflection film for patterning the gate electrodes 33 and 34 and for patterning the source/drain electrodes 42S and 42D.

If an a-C film as an antireflection film is patterned by the method explained with FIG. 9, a pattern size after patterning the a-C film becomes somewhat smaller than the size of the resist pattern.

An a-C film and a resist film were formed on a laminated layer of a polycrystalline silicon film having a thickness of 50 nm and a tungsten silicide film having a thickness of 150 nm, and patterned. The pattern size of the a-C film was smaller by about 0.04 μm (40 nm) than that of the resist pattern. This size difference is usually called critical dimension (CD) shift.

For example, this CD shift of about 0.04 μm is about 16% of a gate length of 0.25 μm. This error cannot be neglected because a precision less than about 10% is requested for gate electrodes of MOSFETS.

From experiments, the present inventors have found that a reduction in a pattern size occurs when $O_2$ RIE is performed. It is hypothesized that the pattern size reduces because in the $O_2$ RIE process, the etching rate of a resist film is much faster than that of the amorphous carbon film.

Many experiments were conducted in order to find the conditions of forming an a-C film having an etching rate in $O_2$ IRE faster than that of a resist film. Etching rates in $O_2$ RIE of a-C films were measured by changing the conditions of plasma enhanced CVD (PECVD) with acetylene $C_2H_2$.

The etching conditions in $O_2$ RIE were an $O_2$ flow of 160 sccm, a pressure of 20 mTorr, and an RF power of about 350 W. The resist etching rate in $O_2$ RIE was about 350 nm/min. The results of the experiments are shown in Table 1.

TABLE 1

Etching of a-C films under various PECVD

| $C_2H_2$ flow sccm | Ar flow sccm | Pressure Torr | Rf power W | Temp °C. | Etch. rate nm/min |
|---|---|---|---|---|---|
| 300 | 100 | 1.0 | 32 | 200 | 104 |
| 300 | 150 | 1.0 | 32 | 200 | 122 |
| 300 | 300 | 1.0 | 32 | 200 | 137 |
| 300 | 150 | 0.8 | 32 | 200 | 117 |
| 300 | 150 | 1.5 | 32 | 200 | 145 |
| 300 | 150 | 1.0 | 32 | 100 | 130 |
| 300 | 150 | 1.0 | 32 | 250 | 124 |
| 300 | 150 | 1.0 | 32 | 300 | 122 |
| 300 | 150 | 1.0 | 32 | 350 | 123 |

Although the a-C films were formed by PECVD with $C_2H_2$ under various conditions of the Ar flow, pressure, and temperature, the etching rates changed only as large as about 50%. The etching rate of a resist film was about 2.4 to 3.4 times as large as those of the a-C films, and a significant increase of the rate of an a-C film relative to that of a resist film obtained.

The inventors tried to change a method of etching an a-C film. From the experiment results of various etching methods, it has been found that the following etching methods provide a-C practical etching rates.

1st Etching Method

An a-C film is etched by RF plasma or RIE by using as an etchant a mixed gas of $CF_4$, $CHF_3$, and Ar.

2nd Etching Method

An a-C film is etched by electron cyclotron resonance (ECR) plasma by using as an etchant a mixed gas of $Cl_2$ and $O_2$.

3rd Etching Method

An a-C film is etched by ECR plasm by using as an etchant a mixed gas of $Cl_2$, $BCl_3$, and $N_2$.

It has been found that these methods provide practical etching rates of a-C films. The experiment results are shown in Table 2.

TABLE 2

Etching methods

| Etchant | Etching Rate of a-C (nm/min) | Etching Rate Ratio of Resist to a-C |
|---|---|---|
| (1) $CF_4$ + $CHF_3$ + Ar | 152 | 3.0 |
| (2) $Cl_2$ + $O_2$ | 159 | 2.9 |
| (3) $Cl_2$ + $BCl_3$ | 143 | 2.1 |
| (r) HBr | 9 | 2.5 |

In Table 2, data of plasma etching using HBr as an etchant is shown for the sake of comparison.

Figure 2A:
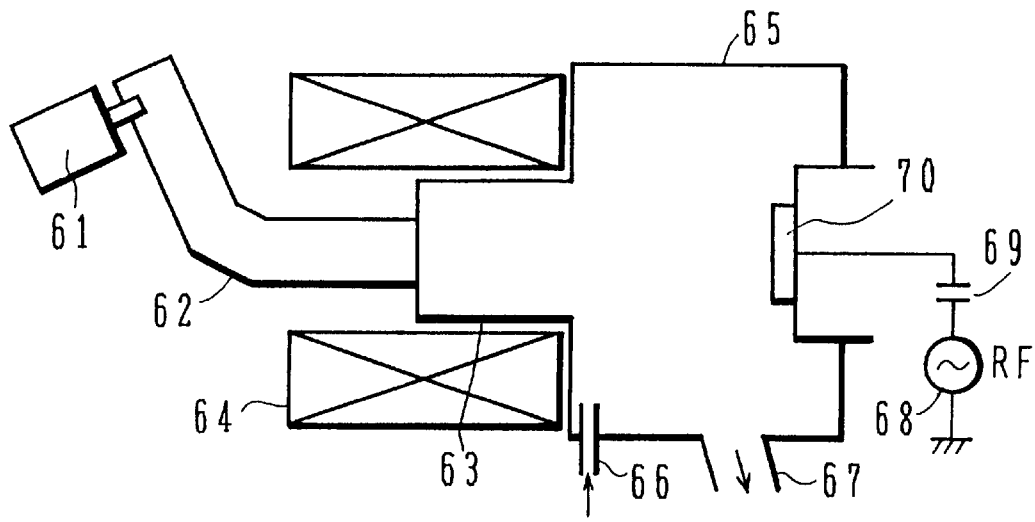
FIGS. 2A to 2C are schematic cross sectional views explaining the process of etching an a-C film and an underlying layer.

FIG. 2A is a schematic diagram showing the structure of an ECR plasma etching apparatus. A microwave generated by a microwave generator 61 is introduced via a waveguide 62 to a plasma generation chamber 63. A magnet coil 64 is placed around the plasma generation chamber 63 so as to generate a divergent magnetic field. The plasma generation chamber 63 is connected to an evacuated process chamber 65 in which a substrate 70 is located.

The evacuated process chamber 65 has an etchant gas inlet 66 and an evacuation port 67 connected to the chamber 65. The substrate 70 is applied with an RF power from an RE power source 68 via a capacitor 69. Plasma generated in the plasma generation chamber 63 is introduced to the divergent magnetic field and moves toward the substrate 70.

Figure 2B:
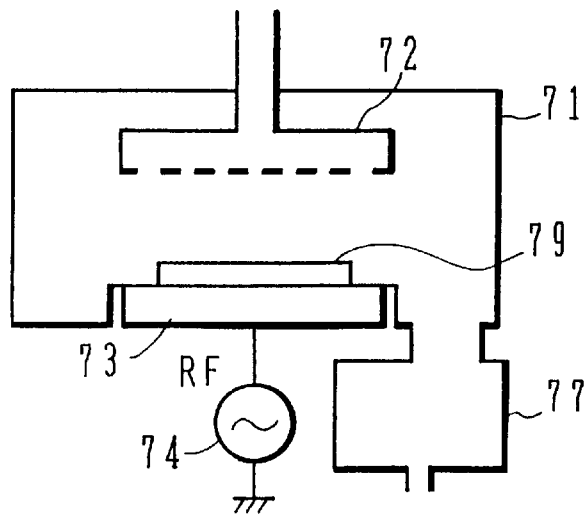

FIG. 2B is a schematic diagram showing the structure of a parallel electrode type plasma etching apparatus. An evacuated process chamber 71 is connected to an evacuation system 77, in which chamber an electrode 72 serving also as an etchant gas inlet is housed. Another electrode 73 corresponding in position and parallel to the electrode 72 is disposed the outer portion exposed to the outside of the evacuated process chamber 71. A substrate 79 is placed on the electrode 73 to which an RF power is supplied from an RF power source 74.

Plasma etching of the first etching method was performed under the conditions of a $CF_4$ flow of 56 sccm, a $CHF_3$ flow of 14 sccm, an Ar flow of 440 sccm, a pressure of 500 mTorr, and an RF power of 550 W. ECR plasma etching of the second etching method was performed under the conditions of a $Cl_2$ flow of 60 sccm, an $O_2$ flow of 10 sccm, a pressure of 5 mTorr, a microwave power of 800 W, and an RF power of 30 W. ECR plasma etching of the third etching method was performed under the conditions of a $Cl_2$ flow of 34 sccm, a $BCl_3$ flow of 47 sccm, an $N_2$ flow of 12 sccm, a pressure of 4.5 mTorr, a microwave power of 1000 W, and an RF power of 200 W. Plasma etching for the sake of comparison was performed under the conditions of an HBr of 150 sccm, a pressure of 10 mTorr, and an Rf power of 200 W. Table 2 shows the above experiment results.

The etching rates of a-C films by the first to third etching methods were about 140 to 160 nm/min. However, the etching rates of resist films by the first to third etching methods were still fast, and the etching rate ratios of resist films to a-C films were about 2.1 to 3.0. In the comparison experiment using HBr, the etching rates of both an a-C film and a resist film were slow.

Although the first to third etching methods could etch a-C films practically sufficiently fast, the etching rates of resist films were twice that of a-C films or greater. The inventors therefore did not expect at that time an improved pattern precision.

Figure 2C:
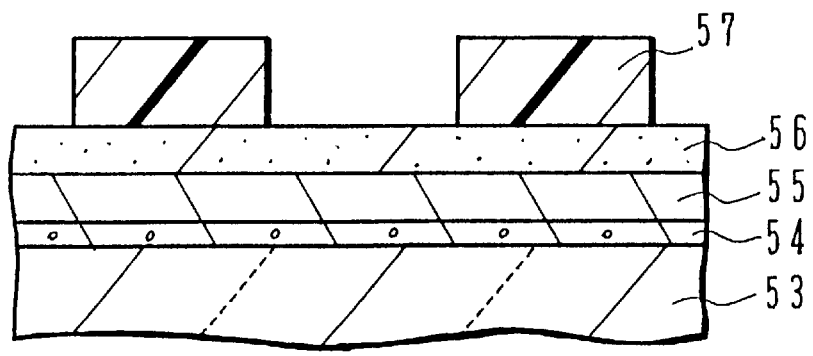

FIG. 2C is a schematic diagram showing the structure of a sample used in measuring a pattern precision. On the surface of a substrate 53, a polycrystalline silicon film 54 having a thickness of about 50 nm was formed. On this film 54, a tungsten silicide film 55 having a thickness of about 150 nm was formed. On this film 55, an a-C film 56 having a thickness of about 40 nm was formed, and on the a-C film 56 a resist pattern 57 having a thickness of about 800 nm was formed.

Table 3 shows the comparison between the experiment results of ECR plasma etching of an a-C film and polycide films using a mixed gas of $Cl_2$ $_{and}$ $_{O2}$ (second etching method) and the experiment results of $O_2$ RIE etching of an a-C film and ECR plasma etching of polycide films using a mixed gas of $Cl_2$ and $O_2$ (conventional method). In the case of the second etching method, the a-C film 56 and polycide films 54 and 55 were successively etched by using etchant gases having generally the same composition.

TABLE 3

| Etching method | Pattern precision | | | |
| --- | --- | --- | --- | --- |
| | (2) $Cl_2/O_2$ | | (P) $O_2$ RIE $Cl_2/O_2$ ECR | |
| Resist width µm | 0.295 | 0.495 | 0.297 | 0.502 |
| Finished width µm | 0.285 | 0.490 | 0.253 | 0.457 |
| CD Shift µm | −0.010 | −0.005 | −0.044 | −0.045 |

As seen from Table 3, the second etching method could etch at a CD shift of one fourth to one ninth of that of the conventional method.

ECR plasma etching with a mixed gas of $Cl_2$ $_{and}$ $_{O2}$ can etch a-C, polycrystalline silicon, and silicide, and has an extremely low etching rate of $SiO_2$. As a result, for example, in patterning a gate electrode of a MOSFET, after an a-C film as an antireflection film and a polycide film are successively etched, the etching can be automatically stopped at the underlying silicon oxide film. Not only a pattern transfer precision can be improved, but also the number of patterning processes using an a-C film as an antireflection film can be reduced.

FIGS. 3A to 3D are schematic cross sectional views explaining a method of patterning a polycide gate structure of a MOSFET.

Figure 3A:
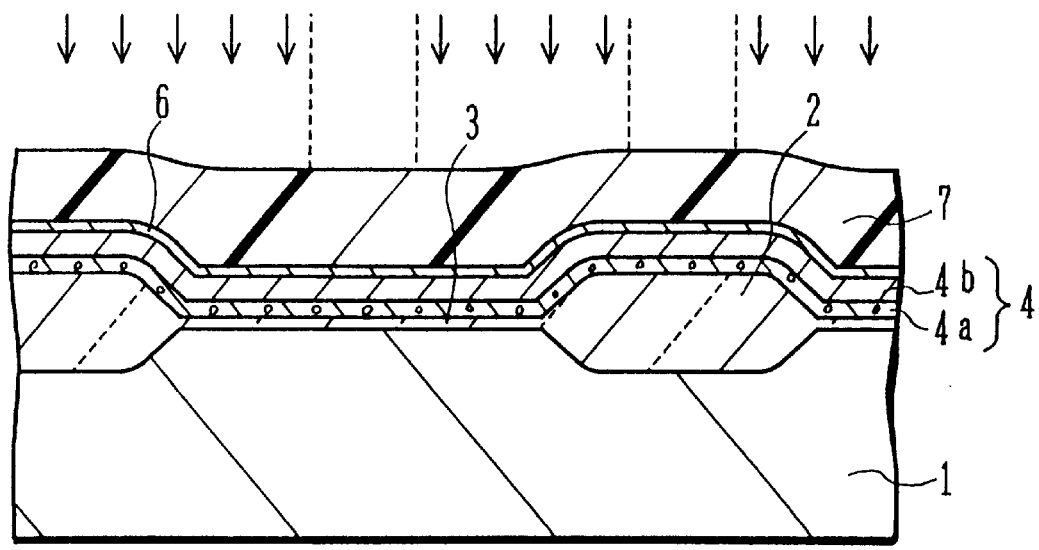
FIGS. 3A to 3D are schematic cross sectional views explaining the process of forming a pattern according to an embodiment of this invention.

As shown in FIG. 3A, a field oxide film 2 for element isolation was formed on the surface of a silicon substrate 1 to a thickness of about 350 nm by local oxidation of silicon (LOCOS) by using a silicon nitride film as a mask.

Next, a gate oxide film 3 was formed on an active region to a thickness of about 8 nm by dry oxidation at about 1000° C. On the oxide films 2 and 3, a gate electrode layer was formed by growing a polycrystalline silicon film 4a to a thickness of about 50 nm at a substrate temperature of 650° C. and by thereafter growing a tungsten silicide film $WSi_x$ 4b to a thickness of about 150 nm at a substrate temperature of 360° C., respectively by low pressure CVD. The polycrystalline silicon film 4a and tungsten silicide film 4b constitute a polycide film 4.

Next, an amorphous carbon film 6 was grown to a thickness of about 40 nm by PECVD. PECVD was performed under the conditions of a $C_2H_2$ flow of 138 sccm, a He flow of 41 sccm, an Ar flow of 30 sccm, a pressure of 1.0 Torr, an RF power of 30 W, and a substrate temperature of 200° C.

On the amorphous carbon film 6, a chemical amplified negative resist film 7 for a KrF excimer laser was coated to a thickness of about 800 nm. The chemical amplification resist contains photoacid generator in resin. Ultraviolet (UV) rays were applied to a local area of the photoresist film 7 by a KrF excimer laser stepper so as to form a latent image.

Figure 3B:
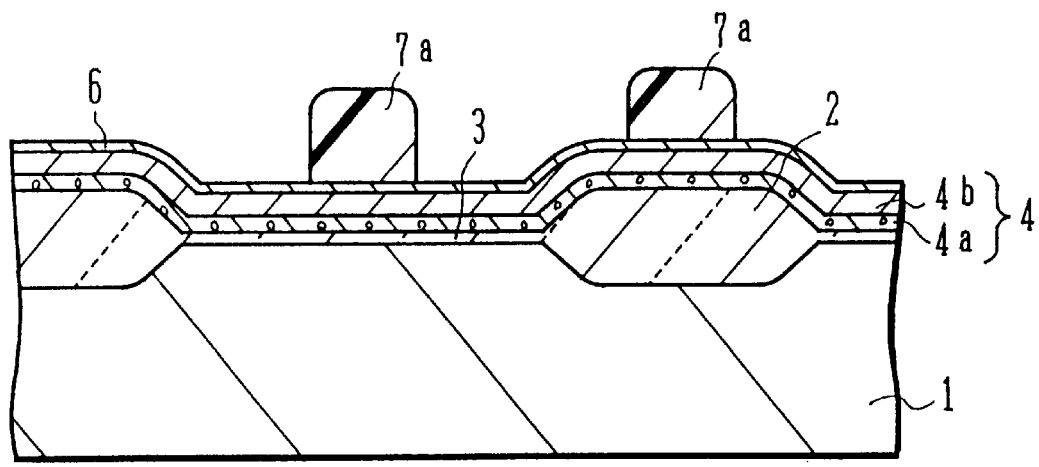

As shown in FIG. 3B, the photoresist film 7 was developed by alkali developing liquid to obtain a resist pattern 7a.

Figure 3C:
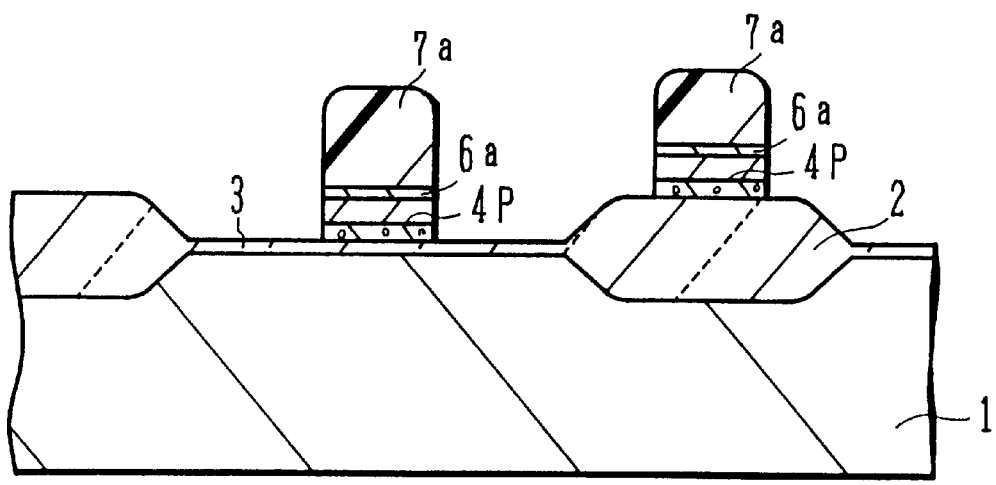

Next, as shown in FIG. 3C, the substrate was loaded in an ECR plasma etching apparatus to perform ECR plasma etching by the second etching method, to successively etch the amorphous carbon film 6 and the underlying polycide gate electrode layer 4, and to form an a-C pattern 6a and a polycide gate electrode pattern 4p.

The conditions of the ECR plasma etching were a $Cl_2$ flow of 60 sccm, an $O_2$ flow of 10 sccm, a pressure of 5 mTorr, a microwave power of 800 W, and an RF power of 30 W.

The etching rate of the a-C film under these conditions was 93.5 nm/min. The etching rates of the tungsten suicide and polycrystalline silicon film were generally equal at about 500 nm/min. The etching process shown in FIG. 3C was performed for about 65 seconds inclusive of over-etching for about 15 seconds.

The etching rate of the amorphous carbon film was different from that shown in Table 2, which resulted from a difference between experiment conditions.

Figure 3D:
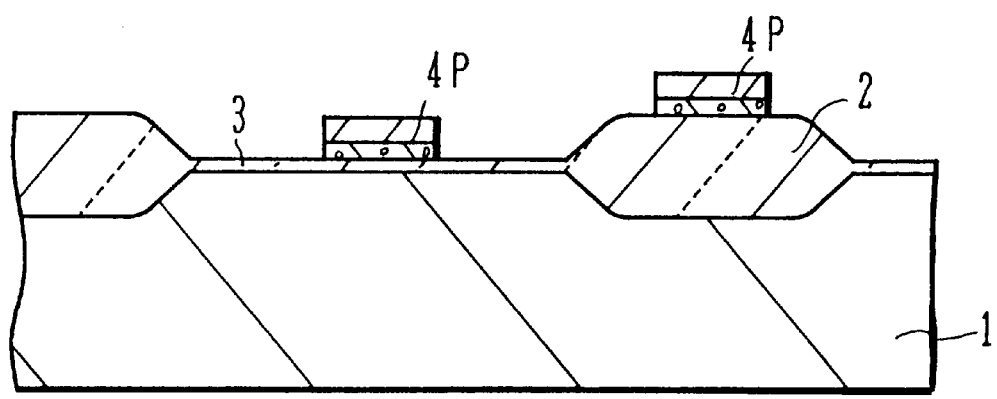

Next, as shown in FIG. 3D, the resist pattern 7a and the underlying amorphous carbon pattern 6a were successively removed by ashing with oxygen plasma. The gate electrode structure 4p of a MOSFET was formed in the above manner.

A difference between the pattern width of the gate electrode and that of the resist pattern was made smaller than when an amorphous carbon film was patterned by $O_2$ RIE and the underlying polycide film was patterned by RIE by using a mixed gas of $Cl_2$ $_{and}$ $_{O2}$.

Although the gate electrode was formed by a laminated film of a tungsten silicide film and a polycrystalline silicon film, it is obvious that the same effects can be obtained by using a single layer of a tungsten silicide film or a polycrystalline silicon film, as the gate electrode film. It is apparent to those skilled in the art that the same effects can be obtained by using a refractory metal such as tungsten as the gate electrode.

Although the conductive layer was formed on the gate oxide film and field oxide film, it is also apparent to those skilled in the art that the same effects can be obtained at a process of patterning a wiring layer on an interlayer insulating film.

Antireflection has been described by forming an amorphous carbon film on a conductive layer. Such an antireflection film may be used when a conductive layer covered with a transparent layer is patterned.

FIGS. 4A to 4E are schematic cross sectional views explaining a patterning process which uses an a-C film as an antireflection film covering an $SiO_2$ film on a polycide film $SiO_2$ film.

Figure 4A:
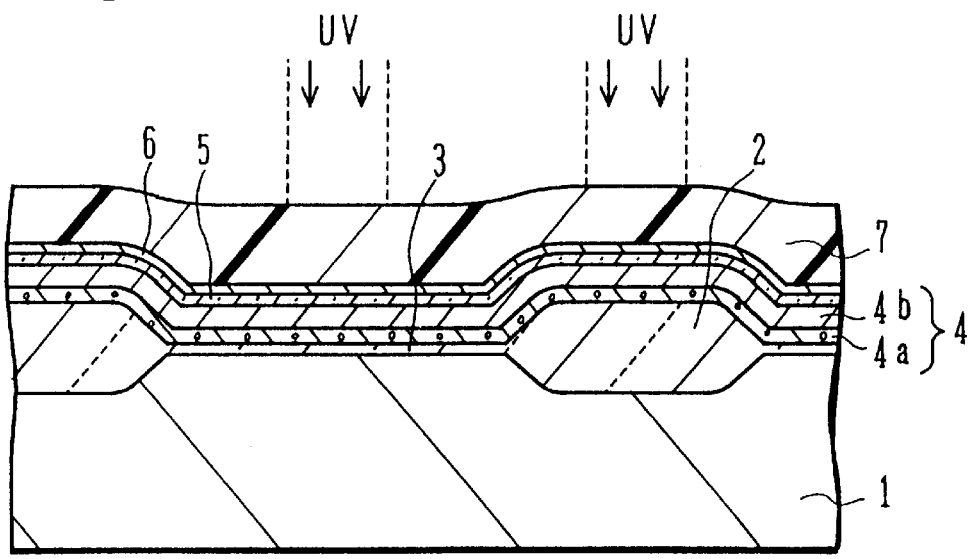
FIGS. 4A to 4E are schematic cross sectional views explaining the process of forming a pattern, the process including a process of etching an a-C film and an underlying layer, according to another embodiment of this invention.

As shown in FIG. 4A, a field oxide film 2 was formed on the surface of a silicon substrate 1 by thermal LOCOS by using a silicon nitride film as a mask. Next, a gate oxide film 3 was formed on an active region. On the oxide films 2 and 3, a polycide layer 4 was formed by depositing a and a tungsten silicide film 4b to a thickness of about 150 nm. The processes up to forming the polycide layer 4 are the same as the first embodiment.

On the polycide layer 4, an SiO film 5 was formed to a thickness of about 60 nm at a substrate temperature of about 800° C. by CVD.

An amorphous carbon film 6 was grown to a thickness of about 40 nm on the $SiO_2$ film 5. On the a-C film 6, a chemically amplified negative resist film 7 for a KrF excimer laser was coated to a thickness of about 800 nm.

The substrate coated with the photoresist film 7 was loaded in an KrF excimer laser stepper. Ultraviolet rays having a wavelength of 248 nm were applied to a local area of the photoresist film 7 to form a latent image.

Figure 4B:
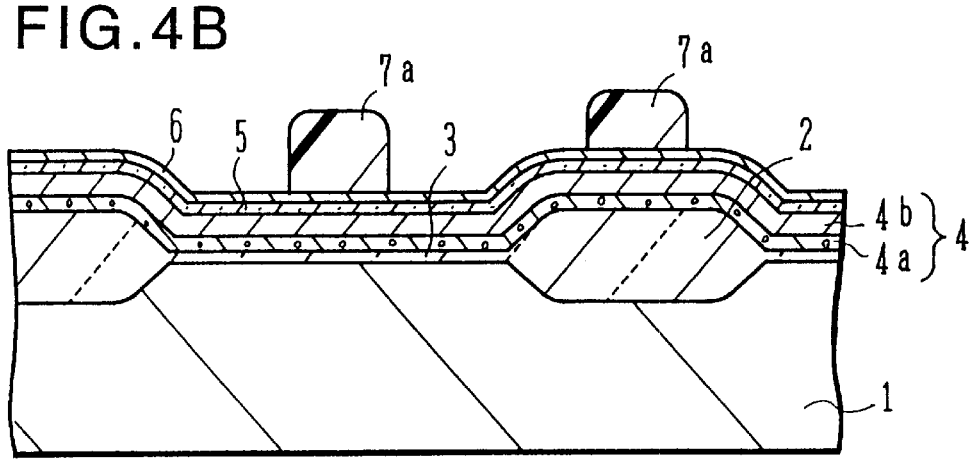
Figure 4C:
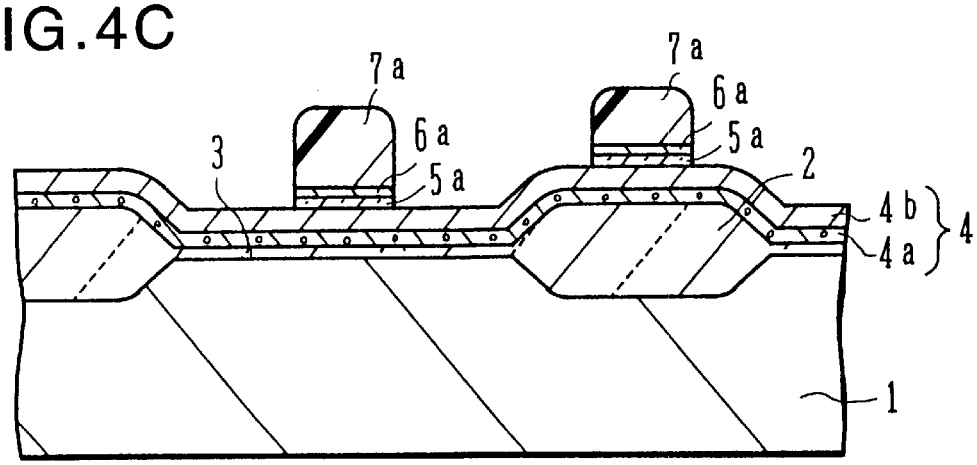

As shown in FIG. 4B, the photoresist film 7 was developed by alkali developing liquid to obtain a resist pattern 7a.

The substrate was loaded in a parallel electrode type plasma etching apparatus such as shown in FIG. 2B.

The a-C film 6 and $SiO_2$ film 5 under the resist pattern 7a were successively etched by using as an etchant a mixed gas of $CF_4$ at a flow of 56 sccm, $CHF_3$ at a flow of 14 sccm, and Ar at a flow of 440 sccm, at a pressure of 500 mTorr, and at an RF power of 500 W (about 6 W/cm$^2$), so as to form an a-C pattern 6a and an $SiO_2$ pattern 5a.

The etching rate of the a-C film 6 was 167 nm/min, and the etching rate of the $SiO_2$ film 5 was 900 nm/min. The etching was preformed for 27 seconds inclusive of over-etching for about 50% of the etching time.

Figure 4D:
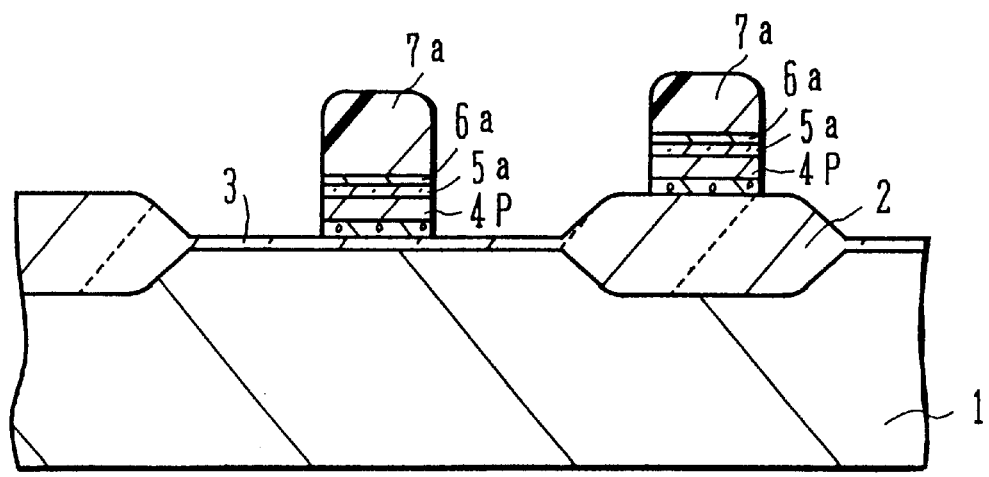

Next, the substrate was loaded in an ECR plasma etching apparatus such as shown in FIG. 2A. As shown in FIG. 4D, the polycide layer 4 was etched by ECR plasma etching for 32 seconds inclusive of over-etching for 8 seconds to thereby form a polycide pattern 4p. The etching was performed by using as an etchant a mixed gas of $Cl_2$ at a flow of 60 sccm and $O_2$ at a flow of 10 sccm, at a pressure of 5 mTorr, at a microwave power of 800 W, and at an RF power of 30 W. The $SiO_2$ film 3 under the polycide layer 4 is not etched.

Figure 4E:
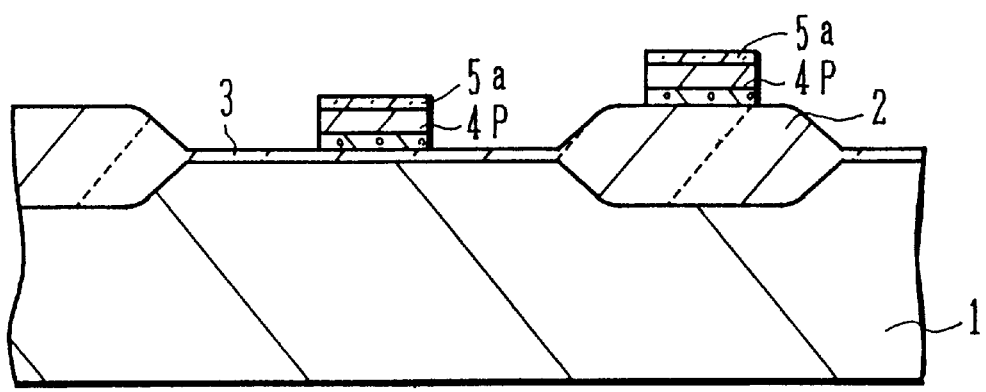

As shown in FIG. 4E, the photoresist pattern 7a and the underlying a-C pattern 6a were successively removed by ashing with oxygen plasma. The polycide gate electrode 4p covered with the $SiO_2$ pattern 5a was formed in the above manner.

Table 4 shows a changes in the pattern size according to this embodiment. For the sake of comparison changes in the pattern size obtained by a conventional method of patterning an a-C film and an underlying $SiO_2$ by different processes are also shown. Values in the parentheses indicate differences from the sizes obtained at the preceding process.

TABLE 4

| | Patterning precision | |
|---|---|---|
| Pattern Forming Method | Embodiment | Conventional |
| Initial resist film thickness | 0.295 | 0.310 |
| Pattern width after $O_2$ RIE μm | . . . | 0.278 (−0.032) |
| Pattern width after Freon plasma etching μm | 0.303 (+0.008) | 0.287 (+0.009) |
| Pattern width after $Cl_2/O_2$ ECR etching μm | 0.309 (+0.007) | 0.302 (+0.014) |
| CD shift μm | +0.014 | −0.008 |

According to this embodiment, the pattern size was increased by 0.0008 μm at the successive etching process of the a-C film and $SiO_2$ film, and the pattern size was increased by +0.007 μm at the patterning process of the polycide layer 4, totalling a size increase of +0.014 μm.

In contrast, the conventional method showed a total size change by −0.0008 μm which is smaller than the embodiment method. At each process, a large size change was observed: a size reduction was −0.032 μm at the patterning process of the a-C film, a size increase was +0.009 μm at the patterning process of the $SiO_2$ film, and a size increase was +0.014 μm at the patterning process of the polycide layer.

A patterning precision by the conventional method was worser than the embodiment method at each process. Although the total size change was smaller than the embodiment method, if the control at each process Is set differently, the size change may become worse than the embodiment method.

It is empirically known that a pattern size increase depends on the pattern density. The pattern size increase of the embodiment method was about 0.014 μm, whereas the pattern size increase of the conventional method is about 0.023 μm which is larger by about 60%.

The following experiments were also conducted for checking how the CD shift becomes small at what pattern density. Similar to the embodiments shown in FIGS. 3A to 3D and 4A to 4E, an $SiO_2$ film to be patterned was deposited to a thickness of about 60 nm and an a-C film as an antireflection film was deposited to a thickness of about 130 nm. On the a-C film, a photoresist film was formed to a thickness of about 800 nm. A dense pattern having a width of about 0.5 μm and a space of about 0.5 μm and a sparse pattern having a width of about 0.5 μm and a space of about 5 μm were formed by using an i line stepper. The a-C film and $SiO_2$ film were etched by using an etchant of $CF_4$+$CHF_3$+Ar.

The experiments were conducted by using an etchant containing $CHF_3$ gas and an etchant not containing $CHF_3$ gas, and by changing the RF power for the former etchant. The etching conditions and size changes of the experiments are shown in Table 5.

TABLE 5

| Etching conditions | | | | |
|---|---|---|---|---|
| $CHF_3$ sccm | $CH_4$ sccm | Ar sccm | Pressure Torr | RF power density W/cm$^2$ |
| 7 | 63 | 440 | 0.5 | 6 |
| . . . | 70 | 440 | 0.5 | 6 |
| 7 | 63 | 440 | 0.5 | 3 |

| Results | | |
|---|---|---|
| CD shift μm | | CD shift difference between dense and sparse |
| Dense | Sparse | μm |
| −0.017 | +0.013 | 0.030 |
| −0.043 | −0.037 | 0.006 |
| . . . | +0.10 | . . . |

The CD shift when using an etchant of $CHF_3$ at a flow of 7 sccm and $CF_4$ at a flow of 63 sccm totalling a flow of 70 sccm was smaller than that using an etchant of only $CF_4$ at a flow of 70 sccm. However, the CD shift difference between sparse and dense patterns when using only, $CF_4$ without using $CHF_3$ was smaller by ⅕ than when using also $CHF_3$.

Device patterns have both dense and sparse patterns so that it has been desired to etch both patterns at a high precision. From this reason, the CD shift is desired to be constant for both dense and sparse patterns. It is therefore preferable to use as an etchant $CF_4$+Ar without adding $CHF_3$ for etching device patterns including various kinds of patterns.

It can be hypothesized that an increased dependence of a pattern transsfer error upon a configuration of dense and sparse patterns caused by adding $CHF_3$ results from that $CHF_3$ plasma is likely to generate molecules and radicals which attach side walls of an a-C film. As the amount of molecules and radicals attached to the side walls increases, the etched shape becomes a positive taper or mesa. In this case, the pattern transfer error is in the direction of increasing its width (positive direction).

Chemical species impinging on to a side wall move isotopically in many cases. The amount of chemical species impinging on a side wall becomes great as the pattern has a wide space. From this reason, it can be hypothesized that the larger the amount of $CHF_3$, the more the pattern transfer error between wide and narrow pattern spaces (pattern space dependency) increased.

In the above embodiments, the pattern transfer error obtained when successively etching an a-C film and an underlying $SiO_2$ film by using as an etchant $CF_4$ and Ar was increased twice or more than by using a mixed gas of $CF_4$, $CFH_3$, and Ar.

However, since this size changes for dense and sparse patterns appear uniform, they can be compensated by selecting suitable parameters of a photolithography process. This pattern size reduction by etching without $CHF_3$ may be used positively.

It can be assumed that a pattern width reduction results from that the skirt area of a resist pattern formed by an i line exposure is etched at the later etching process.

When the RF power density was reduced to 3 $W/cm^2$, the pattern transfer error became wide to +0.1 $\mu$m.

This cause can be assumed to that although chemical species once attached a side wall are not etched at a small RF power, they are etched at a larger RF power so that a vertical side wall is easy to be formed. It may well be deduced that the pattern transfer error can be reduced by properly adjusting an RF power.

An etching rate of an a-C film was about 122 nm by using as an etchant $Cl_2$ at a flow of 34 sccm, $BCl_3$ at a flow of 47 sccm, and $N_2$ at a flow of 12 sccm, at a pressure of 4.5 mTorr, at a microwave power of 100 W, and at an RF power of 200 W.

In order to successively etch an a-C film and an underlying film, it is effective that an etchant contains Cl or F. As a gas containing Cl, in addition to the above-described $Cl_2$ and $BCl_3$, $SiCl_4$, $CCl_4$, $CHCl_3$ and the like may be used. As an etchant gas containing F, in addition to the above-described $C_4F_8$ and $CHF_3$, $C_2F_6$, $C_3F_8$, $C_4F_4$, $SF_6$, and the like may be used.

By using these etchant gases, it is possible to successively etch an a-C film as an antireflection film and a semiconductor layer such as a silicon layer (polycrystalline silicon, amorphous silicon), a silicide layer such as refractory metal silicide, a refractory metal layer such as tungsten, or another layer.

An a-C film is used not only for antireflection but also for other purposes. For example, an a-C film may be used as a conductive layer for making electric charges escape if an electron beam (EB) exposure is used. Also in such a case, an a-C film and an underlying film can be etched successively as in the case of the above embodiments. The embodiment etching method is effective also for a carbon film which is not amorphous but polycrystalline or the like.

The exposure wavelength has been described as the i line of mercury and KrF excimer laser beam. Antireflection can be performed for a shorter wavelength such as an ArF excimer laser beam. A layer to be patterned is not required to be formed on a semiconductor substrate, but it may be formed on a glass substrate. In this case, the embodiment etching process is also applicable.

In the above embodiments, an amorphous carbon film has been formed by PECVD. Other film forming methods may also be used. It is preferable that the optical properties of an a-C film as an antireflection film can be controlled in accordance with its application field.

For example, for presently available photoresist films for the i line and excimer laser, the real part (refractive index) n of a complex refractive index N of an antireflection film is preferably in the range from about 1.4 to 3.0, and the imaginary part k is 0.2 to 1.0 and is preferably high.

The real part n of a complex refractive index N of an a-C film as an antireflection film for the i line (365 nm) patterning is preferably 1.5 to 2.1 and the imaginary part k is preferably 0.6 to 1.0.

The real part n of a complex refractive index N of an a-C film as an antireflection film for the excimer laser beam (248 nm) patterning is preferably 0.5 to 2.0 and the imaginary part k is preferably 0.3 to 1.8. If the real and imaginary parts of a complex refractive index is in the above-described range, a thickness of an a-C film is preferably about 10 to 100 nm.

For the purpose of controlling the optical properties of an a-C film as an antireflection film, the optical constants of a-C films were measured. These a-C films were formed by sputtering and by changing parameters including a substrate temperature, an atmospheric gas pressure, and a sputtering electric power.

Figure 5:
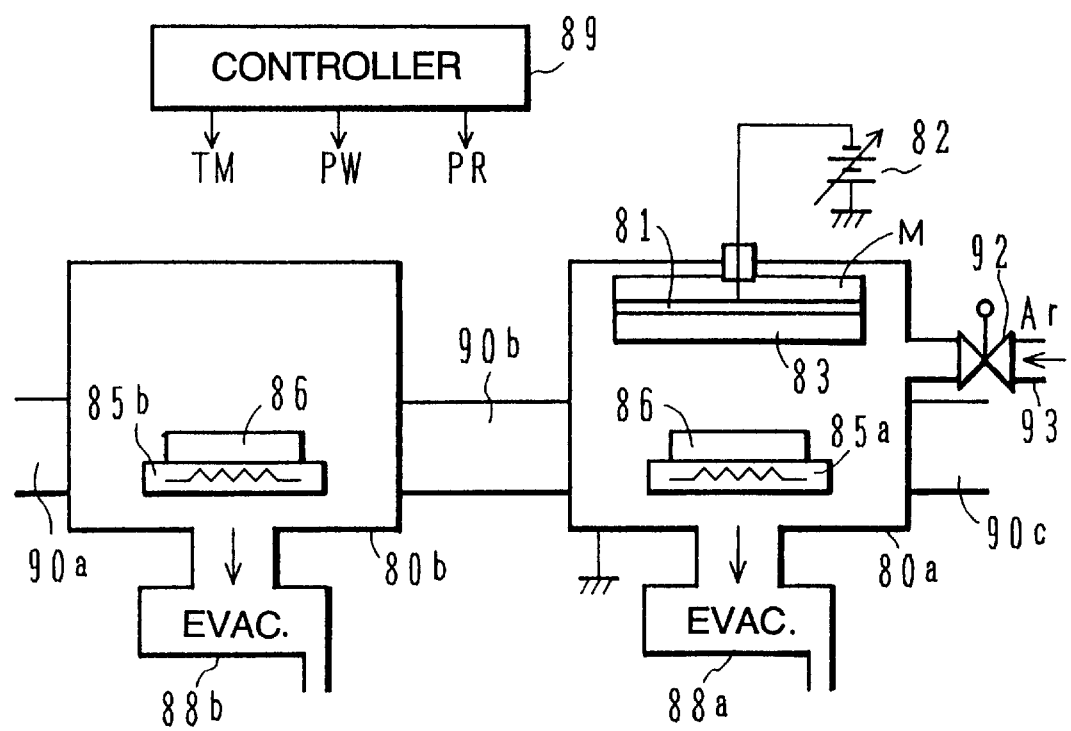
FIG. 5 is a schematic cross sectional view showing an apparatus for forming an a-C film according to another embodiment of this invention.

FIG. 5 is a schematic diagram showing the structure of a sputtering apparatus. Transport paths 90*a*, 90*b*, and 90*c* form a continuous transport path which is bifurcated to evacuated process chambers 80*b* and 80*a*. The evacuated process chambers 80*a* and 80*b* have the same function, the former being used as a sputtering chamber and the latter being used as a spare chamber in this embodiment.

A susceptor 85*a* with a temperature control means such as a heater and cooler is mounted in the evacuated process chamber 80*a*. A substrate 86 is placed on the susceptor 85*a*. The heater may be a resistor type heater, a heating as flow path, or the like. If cooling is necessary, a Peltier element, a refrigerant flow path, or the like may be used.

At the upstream of the susceptor 85*a*, a parallel electrode 81 is disposed which also functions to support a target 83. The parallel electrode 81 is connected to a DC power source 82 and applied with a negative voltage. The evacuated process chamber 80*a* is grounded. A magnet is provided on the electrode 81 to enable magnetron sputtering.

A sputtering Ar as from an Ar source 93 can be supplied via a valve 92 to the evacuated process chamber 80*a*. The evacuated process chamber 80*a* is connected to an evacuation system 88*a* for evacuating as and setting the inside of the chamber 80*a* to a desired vacuum degree.

A controller 89 generates a heating signal U for controlling a heating temperature of the susceptor 85*a*, a power control signal PW for controlling a sputtering power, and a pressure control signal PR for controlling a pressure of the inside of the evacuated process chamber 80*a*, to thereby control the temperature control means of the susceptor 85*a*, sputtering power source 82, valve 92, and evacuation system 88*a*.

The evacuated process chamber 80*b* as a spare chamber has a susceptor 85*b* with a temperature control means. A substrate 86 is placed on the susceptor 85*b*.

FIGS. 6A and 6B, 7A and 7B, and 8A and 8B show the real parts (refractive index ) n and imaginary parts (extinction coefficients) k of complex refractive index of a-C films which were formed by using only the evacuated process chamber 80a and by changing the substrate temperature, pressure, and DC power during sputtering.

Figure 6A:
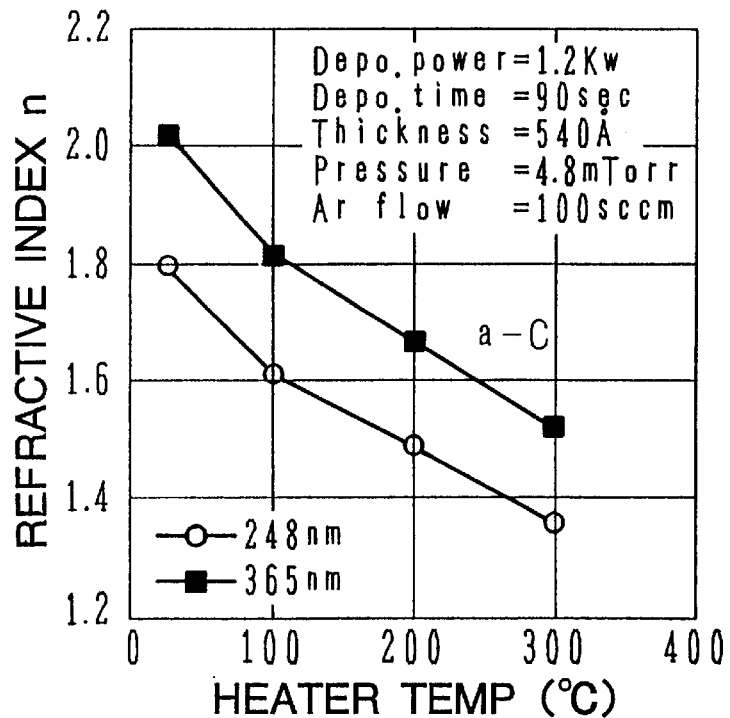
FIGS. 6A and 6B are graphs explaining a change in a refractive index and an extinction coefficient of an a-C film relative to a change in a substrate temperature in a sputtering process.

FIG. 6A shows a change of the refractive index n at the wavelengths 365 nm and 248 nm when the substrate temperature was changed from a room temperature to 300° C. The refractive index changed inversely proportional to the substrate temperature. Specifically, the refractive index changed from about 2.02 to 1.52 at the substrate temperature of about 25 to 300 ° C. at a wavelength of 365 nm, and from about 1.80 to 1.36 at a wavelength of 248 nm.

Figure 6B:
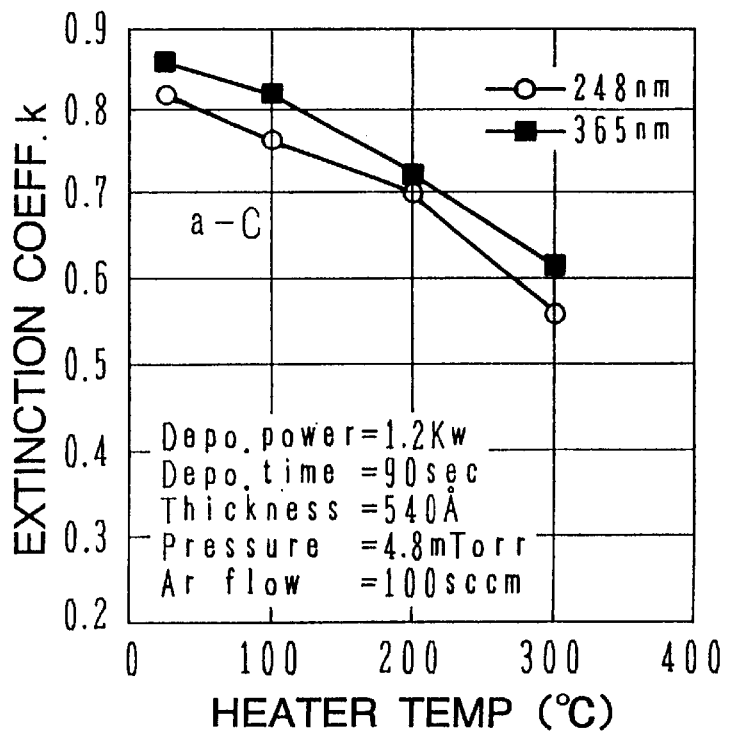

The extinction coefficient k shown in FIG. 6B had a distinctive tendency that it lowered as the substrate temperature was raised, although its change was not so steep as the refractive index. The extinction coefficient k of the a-C film formed at a room temperature and at the wavelength of 365 nm was about 0.86, it lowered as the substrate temperature was raised, and it became about 0.6 at a substrate temperature of 300° C. At the wavelength of 248 nm, the extinction coefficient k was about 0.82 at a room temperature, and about 0.55 at a temperature of 300° C.

After a substrate was pre-heated in the spare chamber 80b, it was transported into the evacuated process chamber 80a and an a-C film was formed by sputtering without any temperature control. In this case, the effect of pre-heating was confirmed.

In the above experiments, the temperature range from a room temperature to 300° C. was used. Obviously, other temperature ranges may be set. Accordingly, if the substrate temperature is changed in a broader range by providing the susceptor with a temperature raising/lowering function, it becomes possible to control the real part refractive index n and an imaginary part extinction coefficient k of a complex refractive index more broadly.

Figure 7A:
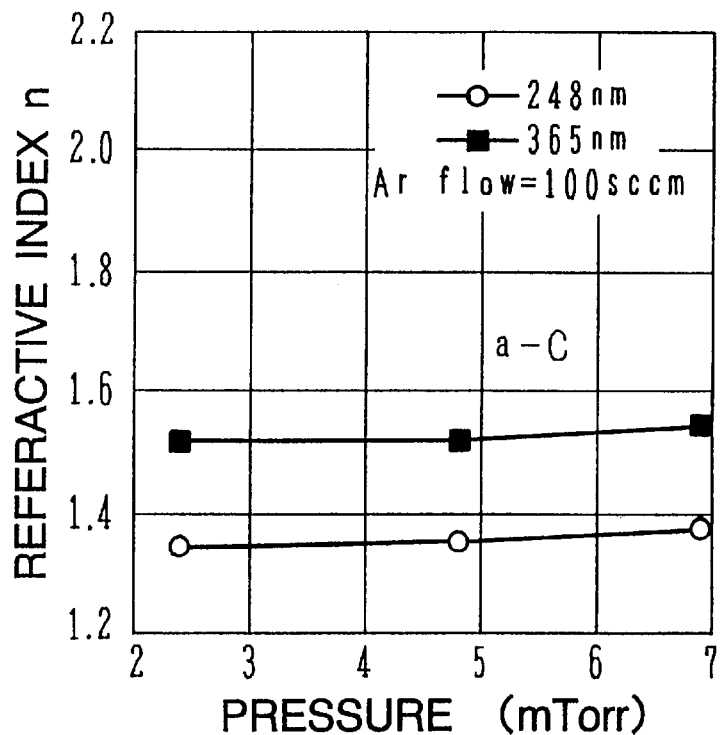
FIGS. 7A and 7B are graphs explaining a change in a refractive index and an extinction coefficient of an a-C film relative to a change in a pressure in a sputtering process.
Figure 7B:
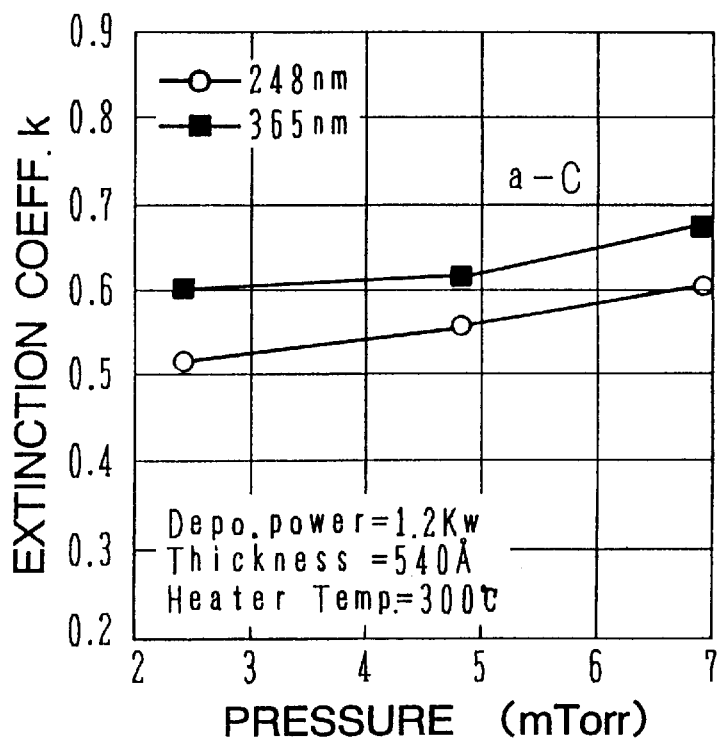

FIGS. 7A and 7B show how the real parts (refractive index) n and imaginary parts (extinction coefficients) k of complex refractive index of a-C films change with an atmospheric as pressure during sputtering. The pressure was changed in a range from about 2.5 mTorr to about 7 mTorr. As seen from FIG. 7A, the refractive index n was not changed so much, but there was a tendency that it slightly increased as the pressure was raised.

The extinction coefficient k showed a change greater than the refractive index $\underline{n}$. It was apparent that the extinction coefficient k increased as the pressure was raised.

Figure 8A:
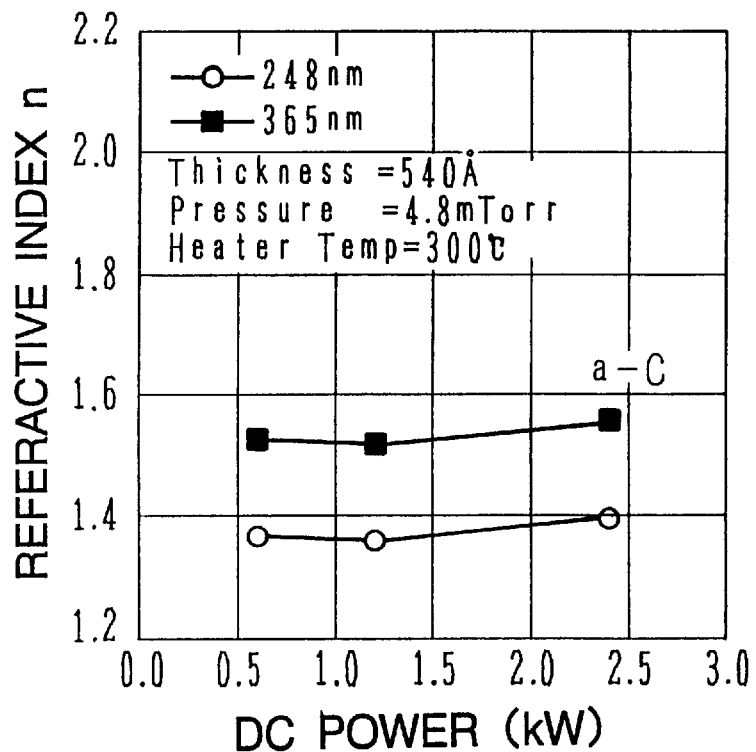
FIGS. 8A and 8B are graphs explaining a change in a refractive index and an extinction coefficient of an a-C film relative to a change in a DC power in a sputtering process.
Figure 8B:
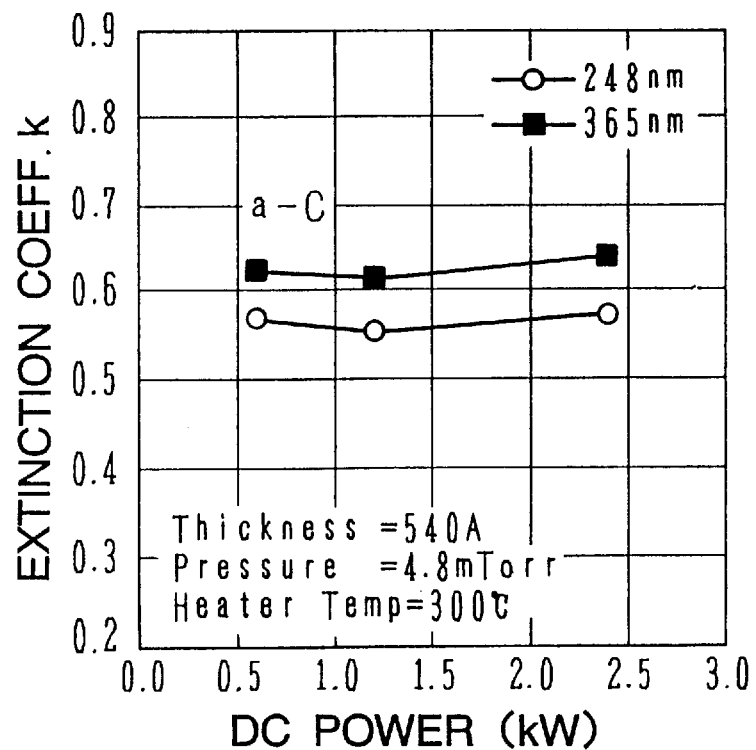
Figure 9A:
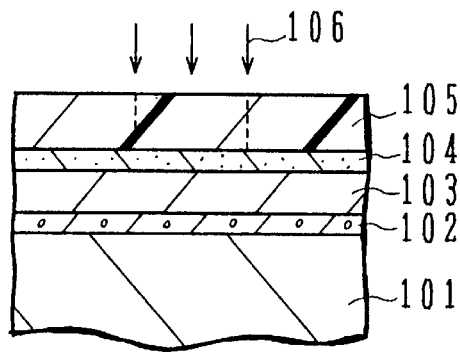
FIGS. 9A to 9E are schematic cross sectional views explaining a conventional process of etching an a-C film and an underlying layer.
Figure 9D:
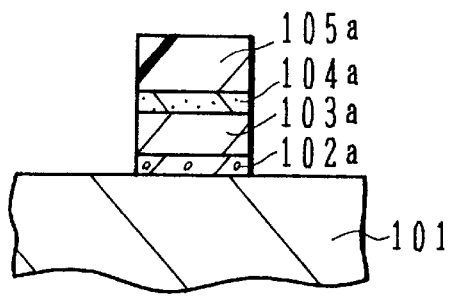
Figure 9B:
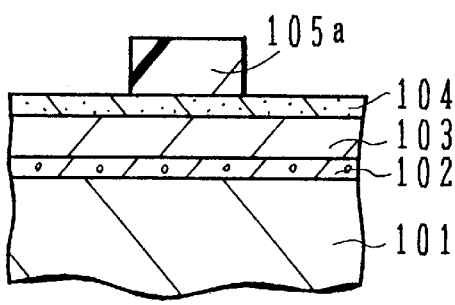
Figure 9E:
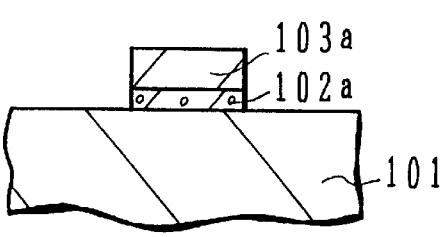
Figure 9C:
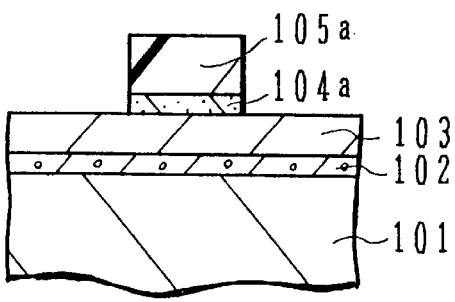

FIGS. 8A and 8B show how the real parts (refractive index) n and imaginary parts (extinction coefficients) k of complex refractive index of a-C films change with a DC power during sputtering.

As seen from FIG. 8A, the refractive index $\underline{n}$ depended not so much on the sputtering power, but there was a tendency that it slightly reduced and thereafter slightly increased as the DC power was changed from 0.5 kW to about 2.5 kW.

As seen from FIG. 8B, the extinction coefficient k showed a tendency that it slightly reduced and thereafter slightly increased as the DC power was increased, similar to the refractive index $\underline{n}$.

Data shown in FIGS. 8A and 8B indicates that a change in the DC power during sputtering cannot be used as a parameter sufficient for positively changing the optical constants of a deposited a-C film, but it becomes useful information for estimating how the optical constants of an a-C film change with the sputtering conditions.

For example, in order to deposit an a-C film having a desired refractive index n and extinction factor k, the substrate temperature is first determined so as to realize the desired refractive index n and then the pressure is determined so as to realize the desired extinction coefficient k at the determined substrate temperature. Thereafter, various parameters are adjusted while taking the control easiness or the like into consideration, and all parameters for the sputtering process are finally determined.

A sputtering method is not limited to the embodiment method, but other methods such as RF sputtering and magnetron sputtering may by used so long as they can control at least a substrate temperature.

The present invention has been described in connection with the preferred embodiments. The invention is not limited only to the above embodiments. It is apparent to those skilled in the art that various modifications, substitutions, combinations and the like can be made without departing from the scope of the appended claims.

We claim:

1. A pattern forming method comprising the steps of:

forming an amorphous film consisting essentially of carbon, on a patterning layer formed on a substrate;

forming a photoresist film on said amorphous film:

selectively exposing and developing said photoresist film to form a photoresist pattern;

successively dry-etching said amorphous film and said patterning layer in one etching step using said photoresist film as an etching mask; and removing said photoresist pattern and said amorphous film.

2. A method according to claim 1, wherein said successive dry-etching step includes an etching step using an etching as in the form of plasma containing at least one of fluorine and chlorine for etching both said amorphous film and said patterning layer.

3. An etching method wherein an amorphous film consisting essentially of carbon, exposed in an opening of a resist pattern is selectively etched by using an etching gas containing chlorine in the form of plasma.

* * * * *